(12) United States Patent
Aketa et al.

(10) Patent No.: US 11,868,023 B2
(45) Date of Patent: Jan. 9, 2024

(54) LIGHT-EMITTING DEVICE AND OPTICAL FIBER

(71) Applicants: Institute for Laser Technology, Osaka (JP); Panasonic Corporation, Osaka (JP)

(72) Inventors: Takanori Aketa, Osaka (JP); Kenichiro Tanaka, Osaka (JP); Noriaki Miyanaga, Osaka (JP)

(73) Assignees: Institute for Laser Technology, Osaka (JP); Panasonic Holdings Corporation, Osaka (JP)

( * ) Notice: Subject to any disclaimer, the term of this patent is extended or adjusted under 35 U.S.C. 154(b) by 79 days.

(21) Appl. No.: 17/628,397

(22) PCT Filed: Jun. 22, 2020

(86) PCT No.: PCT/JP2020/024313
§ 371 (c)(1),
(2) Date: Jan. 19, 2022

(87) PCT Pub. No.: WO2021/014853
PCT Pub. Date: Jan. 28, 2021

(65) Prior Publication Data
US 2022/0283354 A1 Sep. 8, 2022

(30) Foreign Application Priority Data
Jul. 19, 2019 (JP) .................................. 2019-134085

(51) Int. Cl.
*G02F 1/365* (2006.01)
*F21V 8/00* (2006.01)
*G02F 1/35* (2006.01)

(52) U.S. Cl.
CPC ............ *G02F 1/365* (2013.01); *G02B 6/0006* (2013.01); *G02B 6/0008* (2013.01); *G02F 1/353* (2013.01)

(58) Field of Classification Search
CPC .................................. G02F 1/353; G02F 1/365
See application file for complete search history.

(56) References Cited

U.S. PATENT DOCUMENTS

| | | | |
|---|---|---|---|
| 6,529,314 B1 * | 3/2003 | Shukunami | H01S 3/06754 359/332 |
| 2004/0042060 A1 * | 3/2004 | McKinstrie | G02F 1/395 359/341.33 |

(Continued)

FOREIGN PATENT DOCUMENTS

| JP | 2008-010720 A | 1/2008 |
|---|---|---|
| JP | 4299826 B2 | 4/2009 |

(Continued)

OTHER PUBLICATIONS

International Search Report and Written Opinion issued in International Patent Application No. PCT/JP2020/024313, dated Aug. 25, 2020; with partial English translation.

(Continued)

*Primary Examiner* — Daniel Petkovsek
(74) *Attorney, Agent, or Firm* — Rimon P.C.

(57) ABSTRACT

A light-emitting device includes an optical fiber, a first light source unit, and a second light source unit. The optical fiber includes a wavelength converting portion. The wavelength converting portion is provided between a light incident portion and a light emerging portion. The wavelength converting portion contains a wavelength converting material. The wavelength converting material is excited by excitation light to produce a spontaneous emission of light having a longer wavelength than the excitation light and amplifies the spontaneous emission of light to produce an amplified (Continued)

spontaneous emission of light. The first light source unit makes the excitation light incident on the light incident portion. The second light source unit makes seed light, causing a stimulated emission of light to be produced from the wavelength converting material that has been excited by either the excitation light or the amplified spontaneous emission of light, incident on the light incident portion.

10 Claims, 6 Drawing Sheets

(56) References Cited

U.S. PATENT DOCUMENTS

| | | | |
|---|---|---|---|
| 2007/0122103 A1 | 5/2007 | Yamazaki et al. | |
| 2007/0229938 A1 | 10/2007 | Yamazaki et al. | |
| 2007/0258132 A1 | 11/2007 | Zhou et al. | |
| 2009/0067453 A1* | 3/2009 | Mizuuchi | H01S 3/0602 372/6 |
| 2012/0263198 A1 | 10/2012 | Oba et al. | |
| 2015/0318660 A1 | 11/2015 | Oba et al. | |
| 2018/0329130 A1 | 11/2018 | Tanaka | |
| 2023/0152666 A1* | 5/2023 | Sato | H01S 3/06754 359/332 |

FOREIGN PATENT DOCUMENTS

| | | |
|---|---|---|
| JP | 2010-050126 A | 3/2010 |
| JP | 2010-080642 A | 4/2010 |
| JP | 2018-195627 A | 12/2018 |
| WO | 2011/055812 A1 | 5/2011 |
| WO | 2013/059681 A1 | 4/2013 |
| WO | 2013/111271 A1 | 8/2013 |

OTHER PUBLICATIONS

Qiang Ze-Xuan et al. Sep. 1, 2004 (Sep. 1, 2004). "A novel 3-stage structure for a low-noise, high-gain and gain-flattened L-band erbium doped fiber amplifier". Journal of Zhejiang University Science A, Zhejiang University Press, CN, vol. 5, No. 9, pp. 1130-1134.

Extended European Search Report dated Oct. 12, 2022 issued in the corresponding European Patent Application No. 20843791.3.

* cited by examiner

LIGHT-EMITTING DEVICE AND OPTICAL FIBER

CROSS-REFERENCE OF RELATED APPLICATIONS

This application is the U.S. National Phase under 35 U.S.C. § 371 of International Patent Application No. PCT/JP2020/024313, filed on Jun. 22, 2020, which in turn claims the benefit of Japanese Application No. 2019-134085, filed on Jul. 19, 2019, the entire disclosures of which Applications are incorporated by reference herein.

TECHNICAL FIELD

The present disclosure generally relates to a light-emitting device and an optical fiber, and more particularly relates to a light-emitting device and optical fiber including a wavelength converting portion to let light with a different wavelength from excitation light emerge therefrom.

BACKGROUND ART

A light source device including a solid-state light source and a light transmission fiber has been proposed in the art as a light-emitting device (see, for example, Patent Literature 1). In the light source device, the light transmission fiber has a first end face and a second end face, and excitation light emitted from the solid-state light source is introduced into the fiber through the first end face thereof. The light transmission fiber includes a wavelength converting core, a light-guiding core, and a clad. The wavelength converting core contains a wavelength converting material that produces a population inversion state of electrons by absorbing the excitation light and that lets wavelength converted light, falling within the visible radiation range, emerge therefrom. The light-guiding core covers the peripheral surface of the wavelength converting core and transmits the wavelength converted light from the first end face toward the second end face. The clad covers the peripheral surface of the light-guiding core.

The light transmission fiber is configured to have stimulated emission produced by the wavelength converted light propagating through the light-guiding core and to let not only the excitation light, emitted from the solid-state light source, but also the wavelength converted light, amplified by the stimulated emission, emerge from the second end face.

It is difficult for a light-emitting device such as the light source device of Patent Literature 1 to increase the intensity of the wavelength converted light.

CITATION LIST

Patent Literature

Patent Literature 1: JP 2018-195627 A

SUMMARY OF INVENTION

It is therefore an object of the present disclosure to provide a light-emitting device and optical fiber with the ability to increase the intensity of light having a different wavelength from excitation light.

A light-emitting device according to an aspect of the present disclosure includes an optical fiber, a first light source unit, and a second light source unit. The optical fiber includes a light incident portion, a light emerging portion, and a wavelength converting portion. The wavelength converting portion is provided between the light incident portion and the light emerging portion. The wavelength converting portion contains a wavelength converting material. The wavelength converting material is excited by excitation light to produce a spontaneous emission of light having a longer wavelength than the excitation light. The wavelength converting material also amplifies the spontaneous emission of light to produce an amplified spontaneous emission of light. The first light source unit makes the excitation light incident on the light incident portion. The second light source unit makes seed light incident on the light incident portion. The seed light causes a stimulated emission of light to be produced from the wavelength converting material that has been excited by either the excitation light or the amplified spontaneous emission of light.

An optical fiber according to another aspect of the present disclosure includes a light incident portion, a light emerging portion, and a wavelength converting portion. The wavelength converting portion is provided between the light incident portion and the light emerging portion. The wavelength converting portion contains a wavelength converting material. The wavelength converting material is excited by excitation light to produce a spontaneous emission of light having a longer wavelength than the excitation light. The wavelength converting material also amplifies the spontaneous emission of light to produce an amplified spontaneous emission of light. The excitation light and seed light are incident on the light incident portion. The seed light causes a stimulated emission of light to be produced from the wavelength converting material that has been excited by either the excitation light or the amplified spontaneous emission of light.

DESCRIPTION OF EMBODIMENTS

Figure 1:
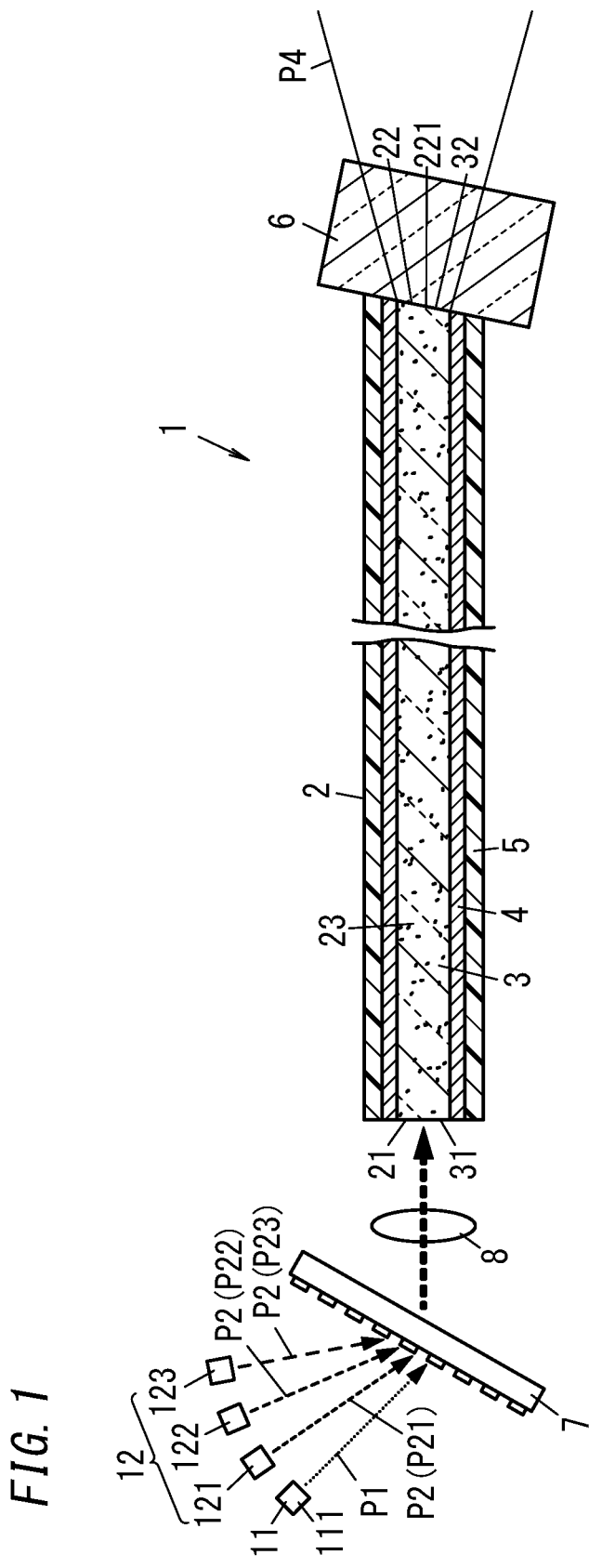
FIG. 1 illustrates a configuration for a light-emitting device according to a first embodiment.

The drawings to be referred to in the following description of first to fourth embodiments and their variations are all schematic representations. Thus, the ratio of the dimensions (including thicknesses) of respective constituent elements illustrated on the drawings does not always reflect their actual dimensional ratio.

First Embodiment

A light-emitting device 1 according to a first embodiment will now be described with reference to FIGS. 1-3.

(1) Overview

The light-emitting device 1 makes excitation light P1 and seed light P2 incident on an optical fiber 2 to which a wavelength converting material is added. The excitation light P1 excites the wavelength converting material. The seed light P2 causes a stimulated emission of light P3 to be produced from the wavelength converting material that has been excited by the excitation light P1. To the optical fiber 2, at least one wavelength converting material may be added. From the optical fiber 2, light P4 including the excitation light P1 and the stimulated emission of light P3 emerges. FIG. 2 illustrates the principle of operation of the light-emitting device 1. In the light-emitting device 1, an electron e⁻ in a ground state E0 (including a plurality of energy levels) of the wavelength converting material is excited to an excitation level E2 by the excitation light P1 that has been incident on the optical fiber 2. Then, the electron e⁻ at the excitation level E2 makes a transition to a metastable level E1, which is an energy level lower than the excitation level E2. Thereafter, the stimulated emission of light P3 is produced when the electron e⁻ at the metastable level E1 is caused to make a transition to one of the highest ones of the plurality of energy levels (hereinafter referred to as a "first energy level") of the ground state E0 by the seed light P2, of which the wavelength corresponds to the difference in energy between the metastable level E1 and the first energy level, for example. In addition, a stimulated emission of light is also produced when the electron e⁻ at the metastable level E1 is caused to make a transition to another energy level lower than the metastable level E1 (hereinafter referred to as a "second energy level") by the seed light, of which the wavelength corresponds to the difference in energy between the metastable level E1 and the second energy level.

The light-emitting device 1 may be used in, for example, light fixtures, lighting devices, lighting systems, projectors, printers, and light sources for endoscopes. The light-emitting device 1 is applicable to not only various types of devices, systems, and other equipment for dwelling houses but also various types of devices, systems, and other equipment for other types of facilities and numerous types of moving vehicles. Examples of moving vehicles to which the light-emitting device 1 is applicable include automobiles, bicycles, railway trains, aircrafts, watercrafts, and drones.

(2) Configuration for Light-Emitting Device

Figure 2:
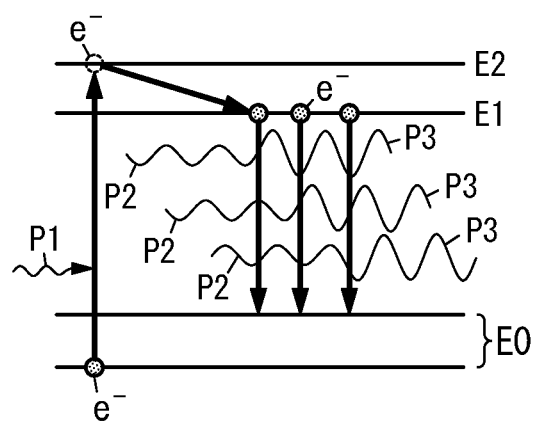
FIG. 2 illustrates the principle of operation of the light-emitting device.

The light-emitting device 1 includes the optical fiber 2, a first light source unit 11, and a second light source unit 12 as shown in FIG. 1. The first light source unit 11 makes the excitation light P1 incident on the light incident portion 21. The second light source unit 12 makes the seed light P2, which causes the stimulated emission of light P3 to be produced from the wavelength converting material that has been excited by the excitation light P1 (hereinafter referred to as "external seed light P2"), incident on the light incident portion 21.

(2.1) Optical Fiber

The optical fiber 2 includes a core 3, a clad 4, and a coating portion 5 as shown in FIG. 1. The clad 4 covers the outer peripheral surface of the core 3. The coating portion 5 covers the outer peripheral surface of the clad 4. A cross section, taken along a plane perpendicular to the optical axis, of the core 3 has a circular shape. The clad 4 is disposed coaxially with the core 3.

The core 3 has a first end face 31 and a second end face 32, which is located at the opposite longitudinal end of the core 3 from the first end face 31. The core 3 includes a light-transmitting material and the wavelength converting material described above. The concentration of the wavelength converting material in the core 3 may or may not be uniform along the entire length of the core 3. The refractive index of the core 3 may be substantially equal to the refractive index of the light-transmitting material that is a main component of the core 3.

The light-transmitting material may be, for example, a fluoride, an oxide, or a nitride. The fluoride may be glass fluoride, for example. The oxide may be a silicon oxide or quartz, for example.

The wavelength converting material is a rare earth element. In this embodiment, the wavelength converting material contains an element selected from the group consisting of, for example, Pr, Tb, Ho, Dy, Er, Eu, Nd, and Mn. The wavelength converting material is contained as an ion of a rare earth element in the core 3, e.g., contained as an ion of Pr ($Pr^{3+}$) or an ion of Tb ($Tb^{3+}$) in the core 3. In this case, the wavelength converting material may be excited by either the excitation light P1 or the light produced by amplifying the spontaneous emission of light, emitted from the wavelength converting material, as internal seed light, i.e., an amplified spontaneous emission (ASE) of light. Through such excitation, the wavelength converting material emits not only an ASE unique to the element of the wavelength converting material but also a stimulated emission of light having the same wavelength as the external seed light P2, thus emitting them as the stimulated emission of light P3. The wavelengths of the ASE and the external seed light P2 are longer than the wavelength of the excitation light P1 (which may fall within the range from 440 nm to 450 nm, for example). The wavelength of the seed light P2 will be described later in the "(2.3) Second light source unit" section.

Figure 3:
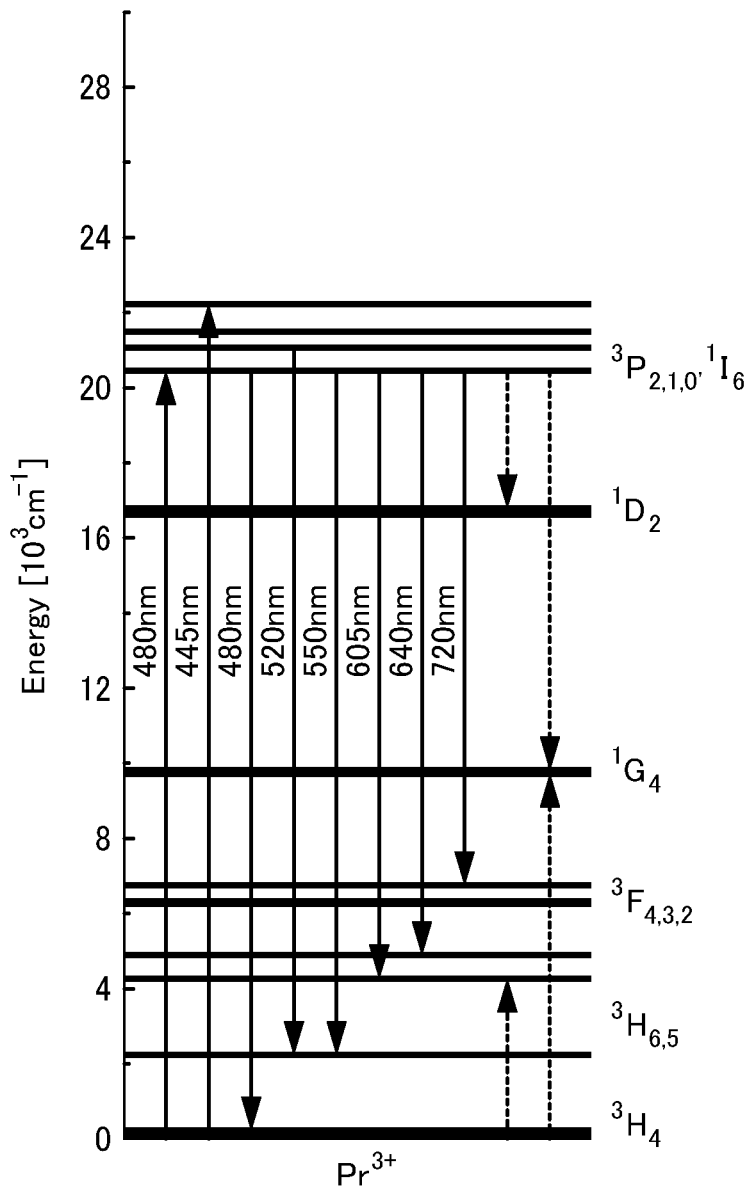
FIG. 3 shows the energy level of a $Pr^{3+}$ ion for use in the light-emitting device.

FIG. 3 is an exemplary energy level diagram of $Pr^{3+}$ (as for FIG. 3, see, for example, Document 1 [C. Krankel, et al., "Out of the blue: semiconductor laser pumped visible rare-earth doped lasers," Laser Photonics Rev. 10, 548 (2016)]). In FIG. 3, the ordinate indicates the electron energy. The signs on the right of FIG. 3 indicate the electronic configuration according to Russell Saunders. Also, in FIG. 3, each of the upward arrows indicates the absorption of excitation light and each of the downward arrows indicates a transition about the spontaneous emission of light or the stimulated emission of light. As can be seen from FIG. 3, $Pr^{3+}$ is a wavelength converting material (wavelength converting element) that may emit either an ASE or amplified seed light in the cyan to red range. The intensity of the stimulated emission of light depends on the respective intensities of the internal seed light (the spontaneous emission of light) and the external seed light. If the core 3 contains $Pr^{3+}$ and $Tb^{3+}$, then $Tb^{3+}$ is excited by absorbing an ASE from Pr' and may produce an ASE having a wavelength unique to $Tb^{3+}$.

The refractive index of the clad 4 is less than the refractive index of the core 3. The clad 4 does not contain the wavelength converting material contained in the core 3.

The coating portion 5 covers the outer peripheral surface of the clad 4. The material of the coating portion 5 may be a resin, for example.

The optical fiber 2 includes the light incident portion 21, the light emerging portion 22, and the wavelength converting portion 23.

The light incident portion 21 is a portion on which the excitation light P1 is incident and may include the first end face 31 of the core 3, for example. The light emerging portion 22 includes the second end face 32 of the core 3, through which light including the excitation light P1 and the stimulated emission of light P3 such as an ASE emerges.

The light incident portion 21 may include a reflection reducing portion for reducing the reflection of the excitation light P1 incident on the light incident portion 21 from outside of the optical fiber 2. The reflection reducing portion may be, for example, an anti-reflection coating that covers the first end face 31 of the core 3. The reflection reducing portion suitably includes a non-reflective coating with respect to light in a deep infrared range with a wavelength of 700 nm or more.

The light emerging portion 22 includes a reflection reducing portion 6 for reducing reflection of the excitation light P1 and the stimulated emission of light P3 including an ASE. The reflection reducing portion 6 is suitably made of a transparent material, of which the refractive index is substantially equal to that of the core 3, for example. The reflection reducing portion 6 includes an end cap, for example. Providing the reflection reducing portion 6 for the light emerging portion 22 allows the optical fiber 2 to reduce an increase in the electric field strength due to reflection from the second end face 32 of the core 3 and also protect the second end face 32 of the core 3 from laser damage. In the light-emitting device 1, if the second end face 32 of the core 3 is in contact with the air, a Fresnel reflection of a few % could be caused at the second end face 32, thus possibly causing parasitic oscillation that makes it difficult to control the optical output. To reduce the Fresnel reflection, the optical fiber 2 suitably includes the reflection reducing portion 6 bonded to the second end face 32 of the core 3. The material for the reflection reducing portion 6 may also be glass fluoride, silicon oxide, or quartz, for example. The light emerging portion 22 has a tilted surface 221 which is tilted by a predetermined angle (of 8 degrees, for example) with respect to a plane intersecting at right angles with the optical axis of the optical fiber 2. This enables, even if there is a refractive index jump between the reflection reducing portion 6 and the core 3, the light-emitting device 1 to reduce components of light reflected back from the boundary between the second end face 32 of the core 3 and the reflection reducing portion 6 to the first end face 31 (i.e., back reflected components) to −60 dB or less, thus causing an increase in the efficiency of the light emerging from the light emerging portion 22. The predetermined angle does not have to be 8 degrees. In this embodiment, the predetermined angle is suitably equal to or greater than 2 degrees, for example, more suitably equal to or greater than 4 degrees, and even more suitably equal to or greater than 6 degrees. Meanwhile, the predetermined angle is suitably equal to or less than 20 degrees, for example, more suitably equal to or less than 16 degrees, and even more suitably equal to or less than 12 degrees. When measured along the optical axis of the optical fiber 2, the length of the end cap suitably falls within the range from 100 μm to 3 mm, for example. In this embodiment, the end cap is disposed over both the core 3 and the clad 4. However, this is only an example and should not be construed as limiting. Rather, the end cap only needs to be disposed on the second end face 32 of the core 3. The reflection reducing portion 6 does not have to be the end cap but may also be, for example, a microscopic surface unevenness (on the order of 200 nm or less) formed on the second end face 32 of the core 3. In that case, the end cap may or may not be provided from the viewpoint of reflection reduction.

The wavelength converting portion 23 is provided between the light incident portion 21 and the light emerging portion 22. The wavelength converting portion 23 contains the wavelength converting material. The wavelength converting material is excited by the excitation light P1 to emit light having a longer wavelength than the excitation light P1. The wavelength converting material is a material that may absorb the excitation light P1 and amplify, by stimulated emission, either the spontaneous emission of light or seed light having a longer wavelength than the excitation light P1. In this embodiment, the wavelength converting portion 23 is provided along the entire length of the core 3 between the light incident portion 21 and the light emerging portion 22. However, this is only an example and should not be construed as limiting. Alternatively, the wavelength converting portion 23 may be provided for only a part of the core 3 between the light incident portion 21 and the light emerging portion 22. That is to say, in this optical fiber 2, the wavelength converting material may be added to either the entire core 3 or only a part of the core 3, whichever is appropriate.

The core 3 may have a diameter falling within the range from 25 μm to 500 μm, for example. The optical fiber 2 may have a length falling within the range from 1 cm to 10 m, for example. As for the length of the optical fiber 2, the wavelength converting portion 23 suitably has a length equal to or greater than 10 cm, more suitably equal to or greater than 30 cm, and even more suitably equal to or greater than 1 m. As for the length of the wavelength converting portion 23, the lower the concentration of the wavelength converting material in the wavelength converting portion 23 is, the greater the length of the wavelength converting portion 23 suitably is. The optical fiber 2 may have a numerical aperture of 0.22, for example.

(2.2) First Light Source Unit

The first light source unit 11 emits the excitation light P1 to excite the wavelength converting material contained in the wavelength converting portion 23 of the optical fiber 2. The excitation light P1 emitted from the first light source unit 11 is incident on the light incident portion 21 of the optical fiber 2.

The first light source unit 11 may include a laser light source 111, for example. The laser light source 111 emits a laser beam. The first light source unit 11 makes the laser beam, emitted from the laser light source 111, incident as the excitation light P1 on the light incident portion 21. The laser light source 111 may be, for example, a semiconductor laser diode that emits a blue laser beam. In that case, the excitation light P1 may have a wavelength falling within the range from 440 nm to 450 nm, for example. The laser light source 111 does not have to be a semiconductor laser diode that emits a blue laser beam but may also be a light-emitting diode (LED) light source or another type of light source (such as a semiconductor laser diode that emits a violet laser beam).

The light coupling method for making the excitation light P1 incident on the light incident portion 21 of the optical fiber 2 may be fiber coupling using an optical fiber coupler or spatial coupling, whichever is appropriate.

In the light-emitting device 1 according to the first embodiment, the first light source unit 11 includes a grating 7 disposed between the laser light source 111 and the light incident portion 21 of the optical fiber 2. The laser beam (excitation light P1) emitted from the laser light source 111 is diffracted by the grating 7 and then incident on the light incident portion 21. The grating 7 may be a transmissive diffraction grating, for example. The material for the grating 7 may be, but does not have to be, quartz, for example.

(2.3) Second Light Source Unit

The second light source unit 12 emits the seed light P2. The seed light P2 emitted from the second light source unit 12 is incident on the light incident portion 21 of the optical fiber 2.

In the light-emitting device 1, the second light source unit 12 makes a plurality of seed light rays P2, having mutually different wavelengths, incident on the light incident portion 21 of the optical fiber 2. In this embodiment, the second light source unit 12 may include, for example, three seed light sources 121, 122, 123 that emit light rays with mutually different wavelengths. The seed light source 121 may be a semiconductor laser diode or an LED that emits a green light ray, for example. The seed light source 122 may be a semiconductor laser diode or an LED that emits an orange light ray, for example. The seed light source 123 may be a semiconductor laser diode or an LED that emits a red light ray, for example. If the wavelength converting material of the wavelength converting portion 23 includes $Pr^{3+}$, then the wavelength of the green amplified light ray is suitably about 520 nm, for example, the wavelength of the orange amplified light ray is suitably about 600 nm, for example, and the wavelength of the red amplified light ray is suitably about 640 nm, for example (see FIG. 3). The seed light sources 121-123 are light sources, each of which emits quasi-monochromatic light. As used herein, the "quasi-monochromatic light" refers to light falling within a narrow wavelength range (with a width of 10 nm, for example).

The second light source unit 12 makes the light ray emitted from the seed light source 121 incident as a seed light ray P2 (P21) on the light incident portion 21 of the optical fiber 2. In addition, the second light source unit 12 also makes the light ray emitted from the seed light source 122 incident as a seed light ray P2 (P22) on the light incident portion 21 of the optical fiber 2. Furthermore, the second light source unit 12 makes the light ray emitted from the seed light source 123 incident as a seed light ray P2 (P23) on the light incident portion 21 of the optical fiber 2.

The second light source unit 12 shares the grating 7 in common with the first light source unit 11. The light (seed light P2) emitted from the second light source unit 12 is diffracted by the grating 7 and then incident on the light incident portion 21.

(3) Operation of Light-Emitting Device

The light-emitting device 1 makes the first light source unit 11 emit the excitation light P1 and also makes the second light source unit 12 emit the seed light P2. Thus, in the light-emitting device 1, the excitation light P1 and the seed light P2 are incident on the light incident portion 21 of the optical fiber 2. Part of the excitation light P1 incident on the light incident portion 21 emerges from the light emerging portion 22. In the light-emitting device 1, the light P4 emerging from the light emerging portion 22 of the optical fiber 2 is mixed light in which the excitation light P1, an ASE with a wavelength of about 480 nm and produced from the wavelength converting material, and the seed light P2 that has been amplified (i.e., the light having the same wavelength as the seed light P2) are mixed together. Four types of stimulated emissions of light P3 with mutually different wavelengths may be, for example, a cyan ray, a green ray, an orange ray, and a red ray. In that case, the mixed light may be white light, for example.

In the optical fiber 2, stimulated emission is produced by the spontaneous emission of light and the seed light P2, and therefore, the excitation light P1 incident on the light incident portion 21 and the stimulated emission of light P3 amplified by stimulated emission emerge from the light emerging portion 22. The mixed light emerging from the light emerging portion 22 of the optical fiber 2 is incoherent light. In the light-emitting device 1, as the light incident through the light incident portion 21 of the optical fiber 2 comes closer toward the light emerging portion 22, the stimulated emission of light P3 increases or decreases. In the light-emitting device 1, the chromaticity, color temperature, color rendering performance, and other parameters of the light P4 emerging from the light emerging portion 22 of the optical fiber 2 are determined by the respective wavelengths of the ASE and the seed light P2. Note that the operation of the light-emitting device 1 is different from the operation of a fiber laser that produces laser oscillation.

In the light-emitting device 1, the wavelength converting material that serves as a heat source is distributed in the core 3 of the optical fiber 2, and therefore, an increase in temperature may be reduced while the light-emitting device 1 is being used.

Optionally, the light-emitting device 1 may include a lens 8 disposed between the grating 7 and the light incident portion 21. The lens 8 is provided to efficiently introduce the excitation light P1 and the seed light P2 into the light incident portion 21 of the optical fiber 2.

Also, the light-emitting device 1 may further include a control member for controlling the intensity of each of the plurality of seed light rays P2. This allows the light-emitting device 1 to control the chromaticity of the light P4 emerging from the light emerging portion 22 of the optical fiber 2. In other words, the light-emitting device 1 may control the color of the emerging light.

The control member may be, for example, an optical member disposed between the plurality of seed light sources 121-123 of the second light source unit 12 and the optical fiber 2 and may include a plurality of wavelength filters. Each of the plurality of wavelength filters may be an optical element including an optical multi-layer film, for example.

The control member does not have to be an optical member including a plurality of wavelength filters but may also be, for example, a plurality of drivers provided one to one for the plurality of seed light sources 121-123 of the second light source unit 12 to drive the plurality of seed light sources 121-123, respectively.

(4) Recapitulation

A light-emitting device 1 according to the first embodiment includes an optical fiber 2, a first light source unit 11, and a second light source unit 12. The optical fiber 2 includes a light incident portion 21, a light emerging portion 22, and a wavelength converting portion 23. The wavelength converting portion 23 is provided between the light incident portion 21 and the light emerging portion 22. The wavelength converting portion 23 contains a wavelength converting material. The wavelength converting material is excited by excitation light P1 to produce a spontaneous emission of light having a longer wavelength than the excitation light P1. The wavelength converting material also amplifies the spontaneous emission of light to produce an amplified spontaneous emission of light. The first light source unit 11 makes the excitation light P1 incident on the light incident portion 21. The second light source unit 12 makes seed light P2 incident on the light incident portion 21. The seed light P2 causes a stimulated emission of light P3 to be produced from the wavelength converting material that has been excited by either the excitation light P1 or the amplified spontaneous emission of light. Thus, the light-emitting device 1 according to the first embodiment enables increasing the intensity of light (i.e., the stimulated emission of light P3) having a different wavelength from the excitation light P1.

In addition, in the light-emitting device 1 according to the first embodiment, the wavelength converting portion 23 contains Pr' as the wavelength converting material. The wavelength converting material not only emits an ASE in cyan but also increases the respective intensities of stimulated emissions in green, orange, and red, because a plurality of seed light rays P2 with mutually different wavelengths are incident onto the light incident portion 21. This allows the light-emitting device 1 according to the first embodiment to improve the color rendering performance of the light P4 emerging from the light emerging portion 22 of the optical fiber 2. Furthermore, in the light-emitting device 1 according to the first embodiment, the wavelength converting portion 23 contains $Pr^{3+}$ and $Tb^{3+}$ as wavelength converting materials, thus enabling further improving the color rendering performance of the light P4 emerging from the light emerging portion 22 of the optical fiber 2. At this time, $Tb^{3+}$ absorbs the ASE in cyan from $Pr^{3+}$, thus not only optimizing the ASE intensity in cyan but also producing an ASE in yellow green (with a wavelength of about 550 nm).

Furthermore, an optical fiber 2 according to the first embodiment includes a light incident portion 21, a light emerging portion 22, and a wavelength converting portion 23. The wavelength converting portion 23 is provided between the light incident portion 21 and the light emerging portion 22. The wavelength converting portion 23 contains a wavelength converting material. The wavelength converting material is excited by excitation light P1 to produce a spontaneous emission of light having a longer wavelength than the excitation light P1. The wavelength converting material also amplifies the spontaneous emission of light by stimulated emission to produce an amplified spontaneous emission of light. The excitation light P1 and seed light P2 are incident on the light incident portion 21. The seed light P2 causes a stimulated emission of light P3 to be produced from the wavelength converting material that has been excited by either the excitation light P1 or the amplified spontaneous emission of light. Thus, the optical fiber 2 according to the first embodiment enables increasing the intensity of light (i.e., the stimulated emission of light P3) having a different wavelength from the excitation light P1.

Second Embodiment

Figure 4:
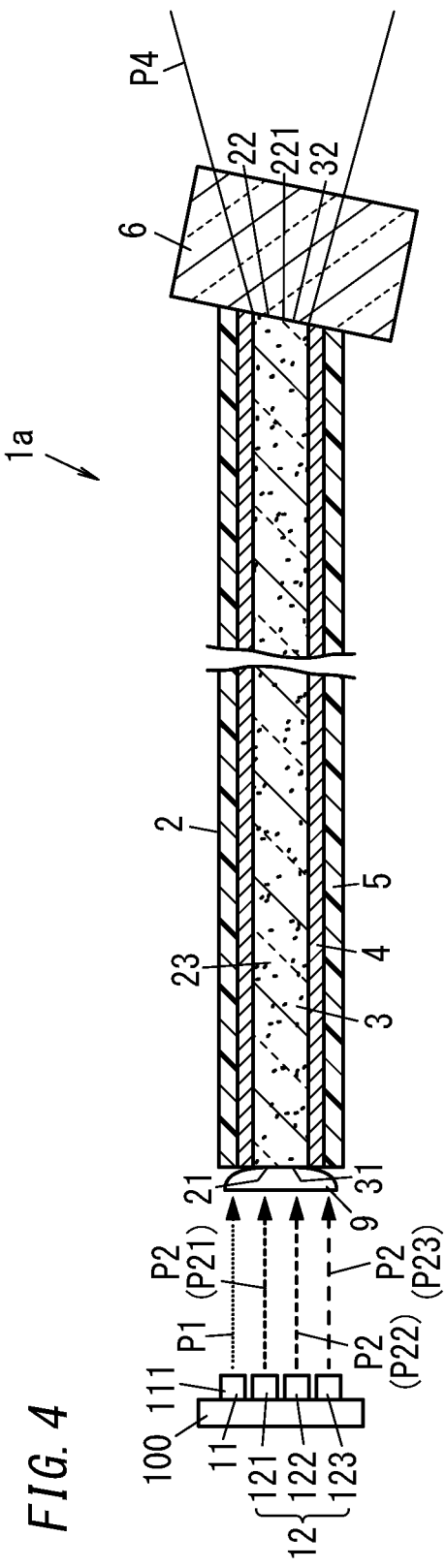
FIG. 4 illustrates a configuration for a light-emitting device according to a second embodiment.

Next, a light-emitting device 1a according to a second embodiment will be described with reference to FIG. 4. In the following description, any constituent element of the light-emitting device 1a according to this second embodiment, having the same function as a counterpart of the light-emitting device 1 of the first embodiment described above, will be designated by the same reference numeral as that counterpart's, and description thereof will be omitted herein.

The light-emitting device 1a according to the second embodiment includes neither the grating 7 nor the control member disposed between the plurality of (e.g., three in the example illustrated in FIG. 1) seed light sources 121-123 of the second light source unit 12 and the optical fiber 2 of the light-emitting device 1 according to the first embodiment. The light-emitting device 1a according to the second embodiment includes a lens 9 disposed between the first light source unit 11 and the second light source unit 12 and the light incident portion 21, which is a major difference from the light-emitting device 1 according to the first embodiment.

The first light source unit 11 and the second light source unit 12 are mounted on a single mount board 100. The first light source unit 11 includes the laser light source 111. The second light source unit 12 includes the plurality of seed light sources 121-123.

The lens 9 may be, for example, a condenser lens for efficiently introducing, into the light incident portion 21 of the optical fiber 2, the excitation light P1 emitted from the first light source unit 11 and the seed light P2 emitted from the second light source unit 12.

In the light-emitting device 1a according to the second embodiment, the wavelength converting portion 23 also includes, as in the light-emitting device 1 of the first embodiment, the wavelength converting material that is excited by excitation light P1 to produce a spontaneous emission of light having a longer wavelength than the excitation light P1 and that amplifies the spontaneous emission of light to produce an amplified spontaneous emission of light. The first light source unit 11 makes the excitation light P1 incident on the light incident portion 21. The second light source unit 12 makes the seed light P2 incident on the light incident portion 21. The seed light P2 causes a stimulated emission of light P3 to be produced from the wavelength converting material that has been excited by either the excitation light P1 or the amplified spontaneous emission of light. This allows the light-emitting device 1a according to the second embodiment to increase the intensity of the light having a different wavelength from the excitation light P1 (i.e., the stimulated emission of light P3).

Optionally, the light-emitting device 1a according to the second embodiment may include, as a control member for controlling the respective intensities of the plurality of seed light rays P2 (P21), P2 (P22), P2 (P23), a plurality of drivers provided one to one for the plurality of seed light sources 121-123 of the second light source unit 12 to drive the plurality of seed light sources 121-123, respectively.

Third Embodiment

Figure 5:
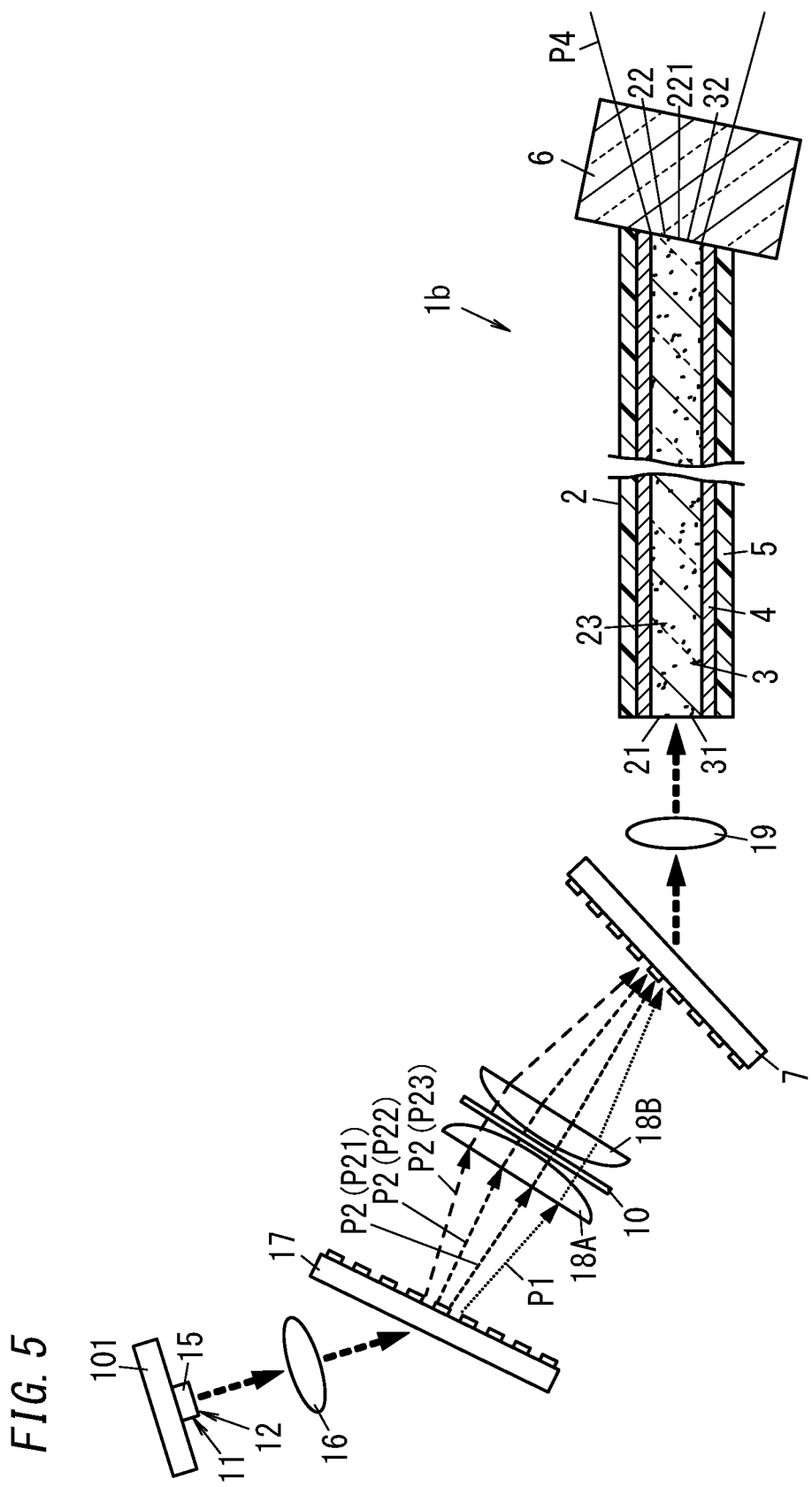
FIG. 5 illustrates a configuration for a light-emitting device according to a third embodiment.

Next, a light-emitting device 1b according to a third embodiment will be described with reference to FIG. 5. In the following description, any constituent element of the light-emitting device 1b according to this third embodiment, having the same function as a counterpart of the light-emitting device 1 of the first embodiment described above, will be designated by the same reference numeral as that counterpart's, and description thereof will be omitted herein.

In the light-emitting device 1b according to the third embodiment, the first light source unit 11 and the second light source unit 12 each include a white light source 15 and a spectroscopic grating 17.

The white light source 15 may be, for example, a white LED including a blue LED chip and a wavelength converting layer. The blue LED chip emits a blue light ray. The wavelength converting layer covers the blue LED chip. The wavelength converting layer includes particles of a wavelength converting material to be excited by the blue light ray emitted from the blue LED chip and emit a yellow light ray. The white light source 15 is mounted on a mount board 101.

The spectroscopic grating 17 separates white light into, for example, the excitation light P1 (the blue light ray) and a plurality of (e.g., three in the example illustrated in FIG. 5) seed light rays P21, P22, P23. The seed light ray P21 may be a green light ray, for example. The seed light ray P22 may be an orange light ray, for example. The seed light ray P23 may be a red light ray, for example. The grating 17 is a transmissive diffraction grating. The material for the grating 17 may be, but does not have to be, quartz, for example.

The light-emitting device 1b further includes a collimator lens 16, a collimator lens 18A, a control member 10, a collimator lens 18B, and a condenser lens 19. The collimator lens 16 is disposed between the white light source 15 and the spectroscopic grating 17. The collimator lenses 18A, 18B are arranged between the spectroscopic grating 17 and the grating 7. The condenser lens 19 is disposed between the grating 7 and the light incident portion 21 of the optical fiber 2.

The collimator lens 16 makes the white light emitted from the white light source 15 incident on the spectroscopic grating 17.

The collimator lens 18A collimates the excitation light P1 and the plurality of seed light rays P21, P22, P23 that have come from the spectroscopic grating 17.

The control member 10 controls the respective intensities of the plurality of seed light rays P21, P22, P23. The control member 10 may include, for example, a filter for controlling the transmission wavelength or a liquid crystal filter with the ability to control the transmittance.

The collimator lens 18B makes the excitation light P1 and the plurality of seed light rays P21, P22, P23 incident on the grating 7.

The grating 7 diffracts the excitation light P1 and the plurality of seed light rays P21, P22, P23 that have been incident thereon.

The condenser lens 19 makes the excitation light P1 and the seed light rays P21, P22, P23, which have been transmitted through the grating 7, incident on the light incident portion 21.

In the light-emitting device 1b according to the third embodiment, the wavelength converting portion 23 also includes, as in the light-emitting device 1 of the first embodiment, the wavelength converting material. The wavelength converting material is excited by the excitation light P1 to produce a spontaneous emission of light having a longer wavelength than the excitation light P1 and amplifies the spontaneous emission of light by stimulated emission to produce an amplified spontaneous emission of light. The first light source unit 11 makes the excitation light P1 incident on the light incident portion 21. The second light source unit 12 makes the seed light P2 incident on the light incident portion 21. The seed light P2 causes a stimulated emission of light P3 to be produced from the wavelength converting material that has been excited by either the excitation light P1 or the amplified spontaneous emission of light. This allows the light-emitting device 1b according to the third embodiment to increase the intensity of the light having a different wavelength from the excitation light P1 (i.e., the stimulated emission of light P3).

Fourth Embodiment

Figure 6:
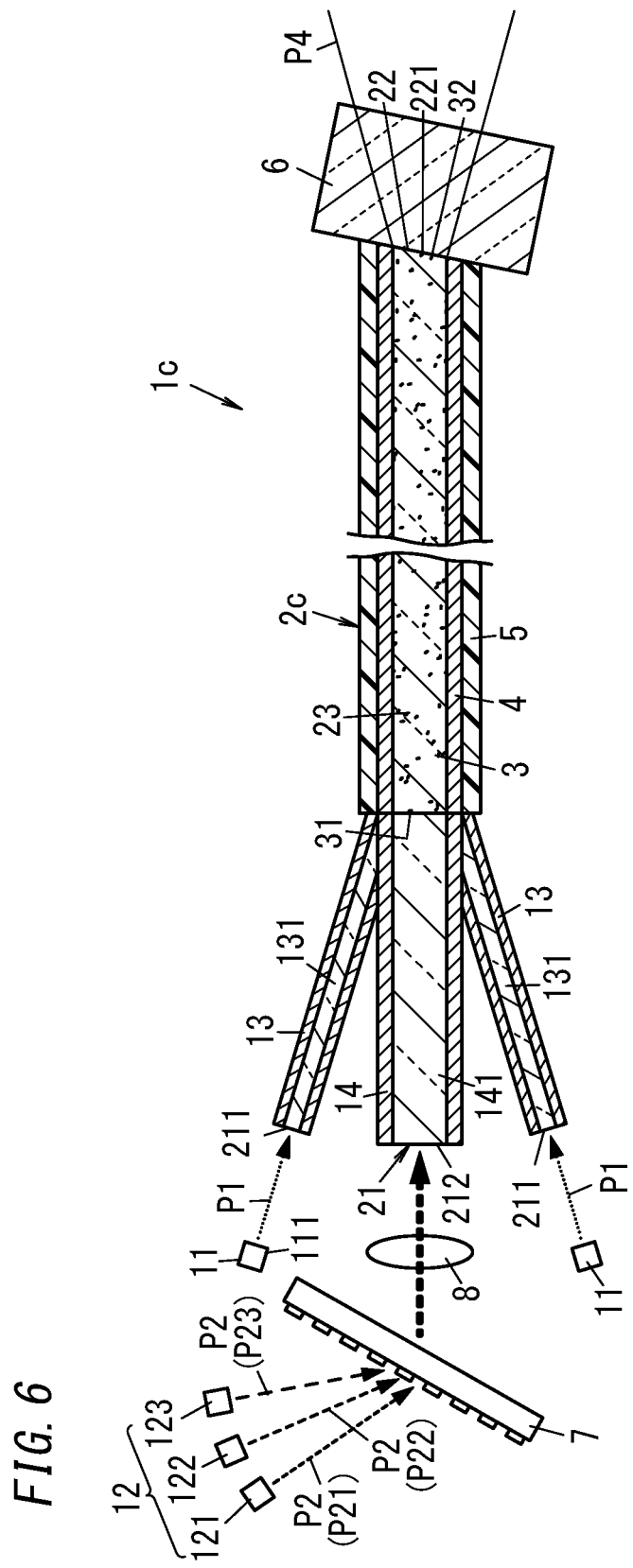
FIG. 6 illustrates a configuration for a light-emitting device according to a fourth embodiment.

Next, a light-emitting device 1c and an optical fiber 2c according to a fourth embodiment will be described with reference to FIG. 6. In the following description, any constituent element of the light-emitting device 1c according to this fourth embodiment, having the same function as a counterpart of the light-emitting device 1 of the first embodiment described above, will be designated by the same reference numeral as that counterpart's, and description thereof will be omitted herein.

The light-emitting device 1c according to the fourth embodiment includes an optical fiber 2c instead of the optical fiber 2 of the light-emitting device 1 according to the first embodiment, which is a major difference from the light-emitting device 1 according to the first embodiment.

The optical fiber 2c further includes first optical fibers 13 and a second optical fiber 14, which are coupled to the first end face 31 of the core 3. Each of the first optical fibers 13 includes a core 131 to which no wavelength converting material is added. The second optical fiber 14 also includes a core 141 to which no wavelength converting material is added. The material for the core 131 may be the same as the main component of the core 3, for example. The material for the core 141 may be the same as the main component of the core 3, for example. The refractive index of the cores 131, 141 is suitably the same as the refractive index of the core 3.

In addition, in the optical fiber 2c according to the fourth embodiment, the light incident portion 21 includes first light incident portions 211 and a second light incident portion 212. The excitation light P1 is incident on each of the first light incident portions 211. The second light incident portion 212 is provided separately from the first light incident portions 211. The seed light P2 is incident on the second light incident portion 212. In this embodiment, a plurality of seed light rays P2 are incident on the second light incident portion 212.

In the optical fiber 2c, each of the first light incident portions 211 is configured as the first optical fiber 13, while the second light incident portion 212 is configured as the second optical fiber 14. The optical fiber 2c includes a plurality of first light incident portions 211. Thus, the light-emitting device 1c includes the plurality of first light incident portions 211. The light-emitting device 1c includes a plurality of first light source units 11. The plurality of first light source units 11 are arranged to correspond one to one to the plurality of first light incident portions 211.

The optical fiber 2c according to the fourth embodiment, as well as the optical fiber 2 according to the first embodiment, includes a light incident portion 21, a light emerging portion 22, and a wavelength converting portion 23. The wavelength converting portion 23 is provided between the light incident portion 21 and the light emerging portion 22. The wavelength converting portion 23 contains a wavelength converting material. The wavelength converting material is excited by excitation light P1 to produce a spontaneous emission of light having a longer wavelength than the excitation light P1. The wavelength converting material also amplifies the spontaneous emission of light by stimulated emission to produce an amplified spontaneous emission of light. The excitation light P1 and seed light P2 are incident on the light incident portion 21. The seed light P2 causes a stimulated emission of light P3 to be produced from the wavelength converting material that has been excited by either the excitation light P1 or the amplified spontaneous emission of light. Thus, the optical fiber 2c according to the fourth embodiment enables increasing the intensity of light (i.e., the stimulated emission of light P3) having a different wavelength from the excitation light P1.

In addition, the optical fiber 2c according to the fourth embodiment includes the first light incident portions 211 and the second light incident portion 212, and therefore, makes it easier for the excitation light P1 and the seed light P2 to be incident on the light incident portion 21.

(Variations)

Note that the first to fourth embodiments described above are only exemplary ones of various embodiments of the present disclosure and should not be construed as limiting. Rather, the first to fourth exemplary embodiments may be readily modified in various manners depending on a design choice or any other factor without departing from the scope of the present disclosure.

For example, in the optical fiber 2, the number of the wavelength converting portion(s) 23 provided between the light incident portion 21 and the light emerging portion 22 does not have to be one but may also be multiple, for example. In the latter case, the plurality of wavelength converting portions 23 are arranged along the optical axis of the core 3.

Also, the light emerging portion 22 does not have to have the tilted surface 221 which is tilted by a predetermined angle with respect to a plane intersecting at right angles with the optical axis of the optical fiber 2. Alternatively, the second end face 32 of the core 3 may intersect at right angles with the optical axis of the optical fiber 2.

Furthermore, the second light source unit 12 may be made up of a plurality of LEDs. In that case, the second light source unit 12 may include a photonic crystal having a super-lens effect between the plurality of LEDs and the light incident portion 21, for example.

Furthermore, in the light-emitting devices 1, 1a, 1c, the second light source unit 12 includes a plurality of seed light sources (e.g., three seed light sources 121-123). However, this is only an example and should not be construed as limiting. Rather, the second light source unit 12 may include at least one seed light source.

Furthermore, the light-emitting device 1b includes the white light source 15. Alternatively, the light-emitting device 1b may include, for example, an SC (super continuum) light source instead of the white light source 15.

(Aspects)

The first to fourth embodiments and their variations described above may be specific implementations of the following aspects of the present disclosure.

A light-emitting device (1; 1a; 1b; 1c) according to a first aspect includes an optical fiber (2), a first light source unit (11), and a second light source unit (12). The optical fiber (2) includes a light incident portion (21), a light emerging portion (22), and a wavelength converting portion (23). The wavelength converting portion (23) is provided between the light incident portion (21) and the light emerging portion (22). The wavelength converting portion (23) contains a wavelength converting material. The wavelength converting material is excited by excitation light (P1) to produce a spontaneous emission of light having a longer wavelength than the excitation light (P1). The wavelength converting material also amplifies the spontaneous emission of light to produce an amplified spontaneous emission of light. The first light source unit (11) makes the excitation light (P1) incident on the light incident portion (21). The second light source unit (12) makes seed light (P2) incident on the light incident portion (21). The seed light (P2) causes a stimulated emission of light (P3) to be produced from the wavelength converting material that has been excited by either the excitation light (P1) or the amplified spontaneous emission of light.

The light-emitting device (1; 1a; 1b; 1c) according to the first aspect enables increasing the intensity of light (i.e., the stimulated emission of light P3) having a different wavelength from the excitation light (P1).

In a light-emitting device (1; 1a; 1b; 1c) according to a second aspect, which may be implemented in conjunction with the first aspect, the wavelength converting material contains an element selected from the group consisting of Pr, Tb, Ho, Dy, Er, Eu, Nd, and Mn.

The light-emitting device (1; 1a; 1b; 1c) according to the second aspect enables, when the wavelength converting material contains two or more elements, for example, excitation by an amplified spontaneous emission of light from at least one element to produce an amplified spontaneous emission of light at a different wavelength from another element.

In a light-emitting device (1; 1a; 1b; 1c) according to a third aspect, which may be implemented in conjunction with the first or second aspect, a plurality of seed light rays (P21, P22, P23), having mutually different wavelengths and forming the seed light (P2), are incident on the light incident portion (21).

The light-emitting device (1; 1a; 1b; 1c) according to the third aspect enables light (P4), including multiple stimulated emissions of light (P3) corresponding one to one to the plurality of seed light rays (P21, P22, P23), to emerge from the light emerging portion (22).

In a light-emitting device (1; 1a; 1c) according to a fourth aspect, which may be implemented in conjunction with the third aspect, the second light source unit (12) includes a plurality of light sources (seed light sources 121, 122, 123) to emit the plurality of seed light rays (P21, P22, P23), respectively.

The light-emitting device (1; 1a; 1c) according to the fourth aspect enables mixed light (light P4), in which the excitation light (P1) and a plurality of stimulated emissions of light (P3) with mutually different wavelengths are mixed together, to emerge from the light emerging portion (22).

A light-emitting device (1; 1a; 1b; 1c) according to a fifth aspect, which may be implemented in conjunction with the fourth aspect, further includes a control member (10) to control respective intensities of the plurality of seed light rays (P21, P22, P23).

The light-emitting device (1; 1a; 1b; 1c) according to the fifth aspect enables controlling the chromaticity of the light (P4) emerging from the light emerging portion (22) of the optical fiber (2).

In a light-emitting device (1b) according to a sixth aspect, which may be implemented in conjunction with the third aspect, the first light source unit (11) and the second light source unit (12) each include: a white light source (15); and a spectroscopic grating (17). The spectroscopic grating (17) lets the excitation light (P1) and the plurality of seed light rays (P21, P22, P23) emerge therefrom by separating light emitted from the white light source (15) into multiple components of the light.

In a light-emitting device (1; 1a; 1b; 1c) according to a seventh aspect, which may be implemented in conjunction with any one of the first to sixth aspects, the light incident portion (21) includes a reflection reducing portion to reduce reflection of the excitation light (P1) and the seed light (P2).

The light-emitting device (1; 1a; 1b; 1c) according to the seventh aspect reduces reflection of the excitation light (P1) and the seed light (P2) when the excitation light (P1) and the seed light (P2) are incident on the light incident portion (21), thus contributing to increasing the optical output of the light (P4) emerging from the light emerging portion (22).

In a light-emitting device (1; 1a; 1b; 1c) according to an eighth aspect, which may be implemented in conjunction with any one of the first to seventh aspects, the light emerging portion (22) has a tilted surface (221) tilted by a predetermined angle with respect to a plane intersecting at right angles with an optical axis of the optical fiber (2).

The light-emitting device (1; 1a; 1b; 1c) according to the eighth aspect contributes to increasing the optical output of the light (P4) emerging from the light emerging portion (22).

In a light-emitting device (1; 1a; 1b; 1c) according to a ninth aspect, which may be implemented in conjunction with any one of the first to eighth aspects, the light emerging portion (22) includes a reflection reducing portion (6) to reduce reflection of the excitation light (P1) and the stimulated emission of light (P3).

The light-emitting device (1; 1a; 1b; 1c) according to the ninth aspect contributes to increasing the optical output of the light (P4) emerging from the light emerging portion (22).

In a light-emitting device (1; 1a; 1c) according to a tenth aspect, which may be implemented in conjunction with any one of the first to ninth aspects, the first light source unit (11) includes a laser light source (111).

The light-emitting device (1; 1a; 1c) according to the tenth aspect enables increasing the intensity of the excitation light (P1).

An optical fiber (2; 2c) according to an eleventh aspect includes a light incident portion (21), a light emerging portion (22), and a wavelength converting portion (23). The wavelength converting portion (23) is provided between the light incident portion (21) and the light emerging portion (22). The wavelength converting portion (23) contains a wavelength converting material. The wavelength converting material is excited by excitation light (P1) to produce a spontaneous emission of light having a longer wavelength than the excitation light (P1). The wavelength converting material also amplifies the spontaneous emission of light to produce an amplified spontaneous emission of light. The excitation light (P1) and seed light (P2) are incident on the light incident portion (21). The seed light (P2) causes a stimulated emission of light (P3) to be produced from the wavelength converting material that has been excited by either the excitation light (P1) or the amplified spontaneous emission of light.

The optical fiber (2; 2c) according to the eleventh aspect enables increasing the intensity of light (i.e., the stimulated emission of light P3) having a different wavelength from the excitation light (P1).

In an optical fiber (2c) according to a twelfth aspect, which may be implemented in conjunction with the eleventh aspect, the light incident portion (21) includes a first light incident portion (211) and a second light incident portion (212). On the first light incident portion (211), the excitation light (P1) is incident. The second light incident portion (212) is provided separately from the first light incident portion (211). On the second light incident portion (212), the seed light (P2) is incident.

The optical fiber (2c) according to the twelfth aspect makes it easier for the excitation light (P1) and the seed light (P2) to be incident on the light incident portion (21).

REFERENCE SIGNS LIST 1, 1a, 1b, 1c Light-Emitting Device
2, 2c Optical Fiber
21, 21c Light Incident Portion
211 First Light Incident Portion
212 Second Light Incident Portion
22 Light Emerging Portion
221 Tilted Surface
23 Wavelength Converting Portion
3 Core
31 First End Face
32 Second End Face
4 Clad
5 Coating Portion
6 Reflection Reducing Portion
7 Grating
8 Lens
9 Lens
10 Control Member
11 First Light Source Unit
111 Laser Light Source
12 Second Light Source Unit
121 Seed Light Source
122 Seed Light Source
123 Seed Light Source
17 Grating
E0 Ground State
E2 Excitation Level
E1 Metastable Level
P1 Excitation Light
P2 Seed Light
P3 Stimulated Emission of Light
P4 Light

The invention claimed is:

1. A light-emitting device comprising:
an optical fiber including a light incident portion, a light emerging portion, and a wavelength converting portion, the wavelength converting portion being provided between the light incident portion and the light emerging portion and containing a wavelength converting material, the wavelength converting material being configured to be excited by excitation light to produce a spontaneous emission of light having a longer wavelength than the excitation light, the wavelength converting material being configured to amplify the spontaneous emission of light to produce an amplified spontaneous emission of light;
a first light source unit configured to emit the excitation light to the light incident portion; and
a second light source unit configured to emit seed light to the light incident portion, the seed light being light for causing a stimulated emission of light to be produced from the wavelength converting material that has been excited by either the excitation light or the amplified spontaneous emission of light, wherein:
the seed light is formed by a plurality of seed light rays, having mutually different wavelengths and the plurality of seed light rays are incident on the light incident portion,
a wavelength of the excitation light falls within the range from 440 to 450 nm, and
the wavelength converting material contains $Pr^{3+}$ and $Tb^{3+}$.

2. The light-emitting device of claim 1, wherein
the second light source unit includes a plurality of light sources configured to emit the plurality of seed light rays, respectively.

3. The light-emitting device of claim 2, further comprising a control member configured to control respective intensities of the plurality of seed light rays.

4. The light-emitting device of claim 1, wherein
the light incident portion includes a reflection reducing portion configured to reduce reflection of the excitation light and the seed light.

5. The light-emitting device of claim 1, wherein
the light emerging portion has a tilted surface tilted by a predetermined angle with respect to a plane intersecting at right angles with an optical axis of the optical fiber.

6. The light-emitting device of claim 1, wherein
the light emerging portion includes a reflection reducing portion configured to reduce reflection of the excitation light and the stimulated emission of light.

7. The light-emitting device of claim 1, wherein
the first light source unit includes a laser light source.

8. A light-emitting device comprising:
an optical fiber including a light incident portion, a light emerging portion, and a wavelength converting portion, the wavelength converting portion being provided between the light incident portion and the light emerging portion and containing a wavelength converting material, the wavelength converting material being configured to be excited by excitation light to produce a spontaneous emission of light having a longer wavelength than the excitation light, the wavelength converting material being configured to amplify the spontaneous emission of light to produce an amplified spontaneous emission of light;
a first light source unit being configured to emit the excitation light to the light incident portion; and
a second light source unit being configured to emit seed light to the light incident portion, the seed light being light for causing a stimulated emission of light to be produced from the wavelength converting material that has been excited by either the excitation light or the amplified spontaneous emission of light, wherein:
the seed light is formed by a plurality of seed light rays, having mutually different wavelengths and the plurality of seed light rays are incident on the light incident portion, and
the first light source unit and the second light source unit each include:
a white light source; and
a spectroscopic grating configured to allow the excitation light and the plurality of seed light rays to emerge from the spectroscopic grating by separating light emitted from the white light source into multiple components of the light.

9. An optical fiber comprising:
a light incident portion;
a light emerging portion; and
a wavelength converting portion provided between the light incident portion and the light emerging portion and containing a wavelength converting material, the wavelength converting material being configured to be excited by excitation light to produce a spontaneous emission of light having a longer wavelength than the excitation light, the wavelength converting material being configured to amplify the spontaneous emission of light to produce an amplified spontaneous emission of light, wherein:
the wavelength converting material is configured such that seed light incident on the light incident portion causes a stimulated emission of light from the wavelength converting material that has been excited by either the excitation light or the amplified spontaneous emission of light,
the seed light is formed by a plurality of seed light rays having mutually different wavelengths and the plurality of seed light rays are incident on the light incident portion, and
the wavelength converting material contains $Pr^{3+}$ and $Tb^{3+}$.

10. The optical fiber of claim 9, wherein
the light incident portion includes:
a first light incident portion on which the excitation light is incident; and
a second light incident portion which is provided separately from the first light incident portion and on which the seed light is incident.

* * * * *